United States Patent
Rapoport

(10) Patent No.: US 7,719,279 B2
(45) Date of Patent: May 18, 2010

(54) SELF-FASTENING CAGE SURROUNDING A MAGNETIC RESONANCE DEVICE AND METHODS THEREOF

(75) Inventor: Uri Rapoport, Moshav Ben Shemen (IL)

(73) Assignee: Aspect Magnet Technologies Ltd., Ramat Gan (IL)

( * ) Notice: Subject to any disclaimer, the term of this patent is extended or adjusted under 35 U.S.C. 154(b) by 0 days.

(21) Appl. No.: 12/127,338

(22) Filed: May 27, 2008

(65) Prior Publication Data

US 2008/0246476 A1    Oct. 9, 2008

Related U.S. Application Data

(62) Division of application No. 11/376,608, filed on Mar. 15, 2006, now Pat. No. 7,400,147.

(60) Provisional application No. 60/732,654, filed on Nov. 3, 2005.

(51) Int. Cl.
    *G01V 3/00* (2006.01)
(52) U.S. Cl. ..................................... 324/320
(58) Field of Classification Search ......... 324/300–322; 600/410–435
    See application file for complete search history.

(56) References Cited

U.S. PATENT DOCUMENTS

| | | | | |
|---|---|---|---|---|
| 4,514,691 A * | 4/1985 | De Los Santos et al. .... | 324/301 |
| 5,252,924 A * | 10/1993 | Sakurai et al. .............. | 324/320 |
| 5,359,310 A * | 10/1994 | Pissanetzky ................. | 335/301 |
| 5,525,904 A * | 6/1996 | Hanley et al. ................ | 324/300 |
| 5,621,324 A * | 4/1997 | Ota et al. ..................... | 324/319 |
| 5,952,830 A * | 9/1999 | Petropoulos et al. ........ | 324/318 |
| 6,208,144 B1 * | 3/2001 | McGinley et al. ............ | 324/319 |
| 6,259,252 B1 * | 7/2001 | Laskaris et al. ............. | 324/319 |
| 6,404,199 B1 * | 6/2002 | Fujita et al. ................. | 324/318 |
| 7,084,633 B2 * | 8/2006 | Aoki et al. ................... | 324/319 |
| 7,400,147 B2 * | 7/2008 | Rapoport ..................... | 324/318 |
| 7,535,228 B2 * | 5/2009 | Tiernan et al. .............. | 324/318 |

\* cited by examiner

*Primary Examiner*—Brij B Shrivastav
*Assistant Examiner*—Dixomara Vargas
(74) *Attorney, Agent, or Firm*—Gottlieb, Rackman & Reisman, P.C.

(57) ABSTRACT

The present invention discloses a self-fastening cage of a magnetic resonance device (MRD) for providing a homogeneous, stable and uniform magnetic field therein, characterized by an outside shell comprising at least three flexi-jointed superimposed walls. The multi-streamed MRD comprising a cage including a closed magnetic circuit constructed from strong permanent magnets; and optionally a shimming mechanism selected from an array of active shim coils, passive shimming elements; a contained cavity within which the magnetic field strength is approximately uniform; and a plurality of conveyor belts, pipes or any transportation means by which a plurality of samples are introduced into the region of uniform magnetic field; such that magnetic resonance measurements are made on a plurality of samples within the region of uniform magnetic field. The invention depicts a cost effective method for obtaining a self-fastening cage.

20 Claims, 15 Drawing Sheets

Figure 1:
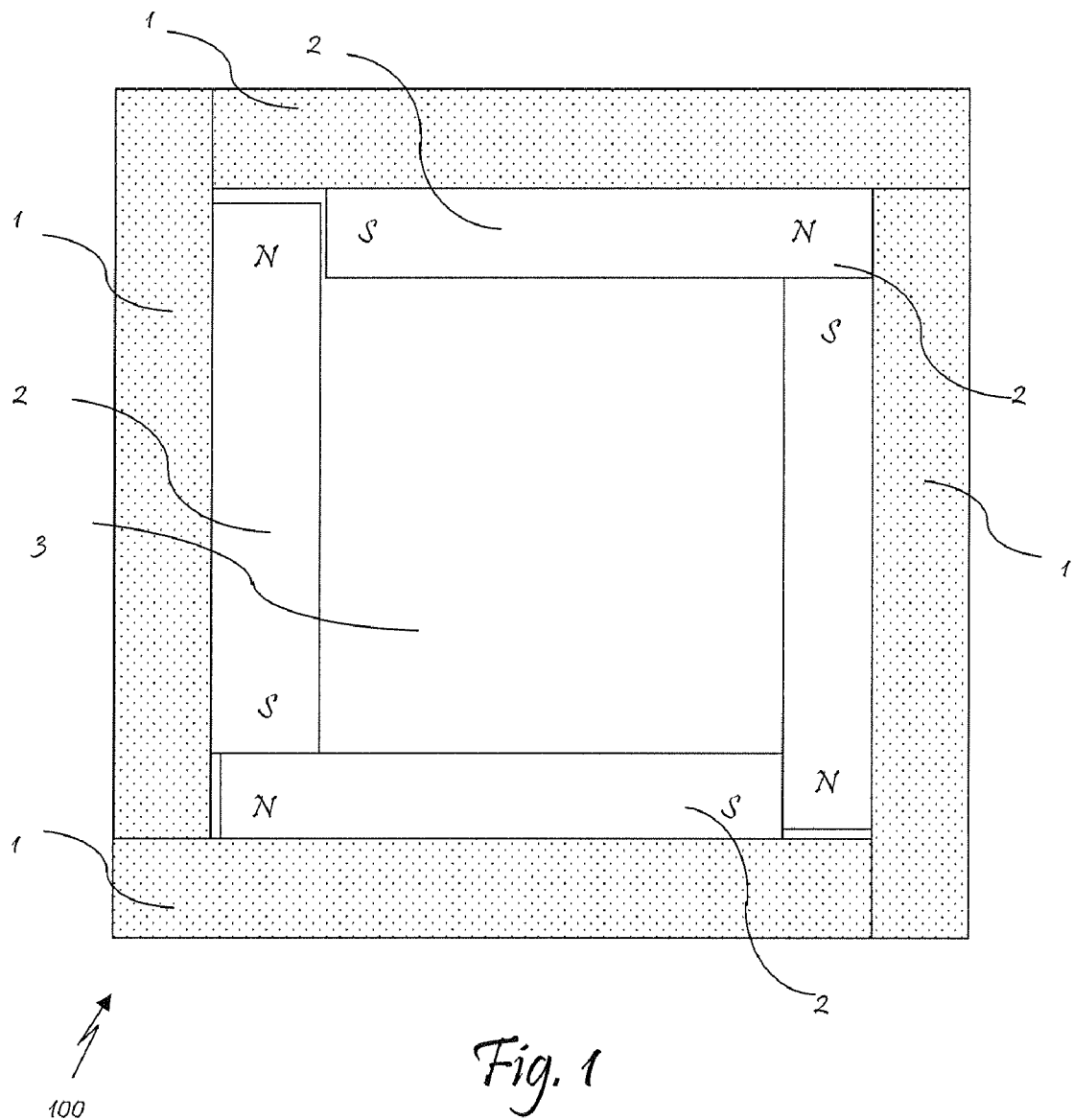

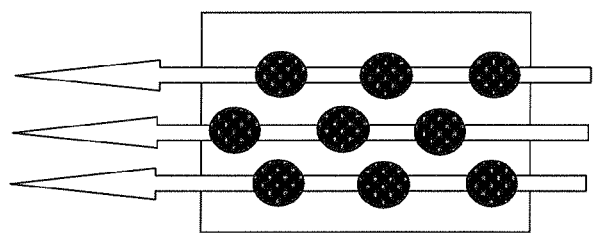
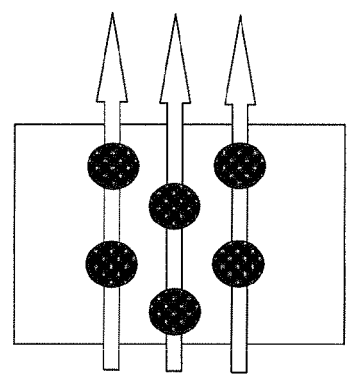
Fig. 19A          Fig. 19B
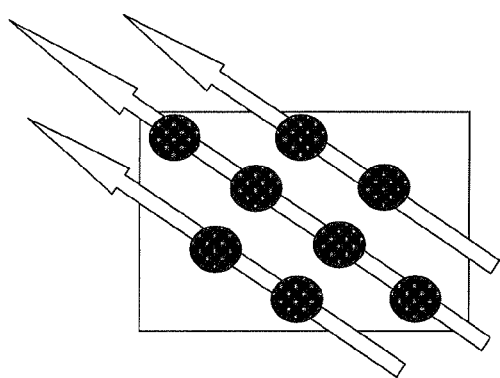
Fig. 19C
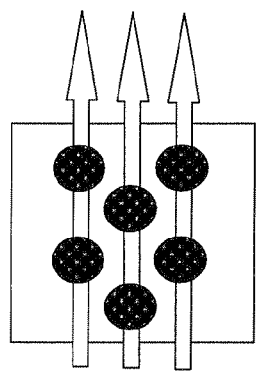
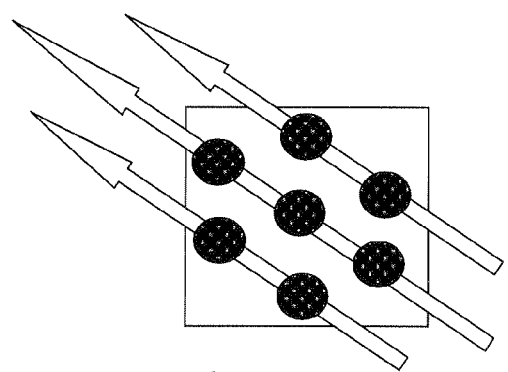
Fig. 19D          Fig. 19E

SELF-FASTENING CAGE SURROUNDING A MAGNETIC RESONANCE DEVICE AND METHODS THEREOF

This application is a Divisional of U.S. Ser. No. 11/376,608 filed Mar. 15, 2006, now U.S. Pat. No. 7,400,147 which claims the priority date of U.S. Provisional Patent Application 60/732,654 filed Nov. 3, 2005.

FIELD OF THE INVENTION

The present invention generally relates to a self-fastening cage surrounding a magnetic resonance device (MRD) for providing a homogeneous, stable and uniform magnetic field therein. More specifically, the present invention relates to a self-fastening cage characterized by an outside shell comprising at least three flexi-jointed superimposed walls.

BACKGROUND OF THE INVENTION

Electromagnetic based instruments for measuring properties of matter or identifying its composition are well known. Magnetic resonance spectroscopy is one of the principal measuring techniques used to obtain physical, chemical and structural information about a molecule. In order to be able to perform magnetic resonance spectroscopy with high resolution capabilities providing a high quality image (i.e., resolution and contrast) the magnetic field used must be extremely stable and uniform.

However in order to achieve such uniformity, elements correcting the inhomogeneousness of the main magnetic field are added, according to the principle of fields' superposition. Coils, magnetic parts, or all other means enabling correction of the imperfections of the principal field are added in order to obtain a homogeneous total field in the zone of interest.

U.S. Pat. No. 5,959,454 to Westphal et al. discloses a magnet arrangement for an NMR tomography system, in particular for skin and surface examinations, which contains a one sided NMR system having two ring magnets and a cylindrical magnet. Their respective locations provide a certain degree of uniformity.

U.S. Pat. No. 6,191,584 presents a permanent magnet for NMR image detection which contains a magnetic structure having a yoke and magnetic poles, so shaped as to delimit or enclose a cavity.

In order to achieve a uniform and strong magnetic field using permanent magnet material, the use of simple permanent magnet structures, like C-magnet or H-magnet, is not suitable. Therefore, much more complex assemblies are needed in order to achieve the required magnetic field. Modern magnetic material today can hold high magnetic energy, and if a magnetic circuit is designed correctly, uniformity and field strength can be achieved and controlled with high efficiency. A cost-effective self-fastening cage useful for providing a homogeneous, stable and uniform magnetic field, thus still meets a long felt need.

SUMMARY OF THE INVENTION

It is thus one embodiment of the present invention to provide an efficient self-fastening cage of a MRD (100) for providing a homogeneous, stable and uniform magnetic field therein, characterized by an outside shell comprising at least three flexi-jointed superimposed walls (1).

It is also in the scope of the present invention wherein the MRD further comprises at least six side-magnets (2) arranged in two equal groups face-to-face orientation in a magnetic connection with the cage walls (1), increasing the overall strength of the magnetic field provided in said cage; at least two pole-pieces (3), arranged in a face-to-face orientation in between side-magnets (2); and, at least two main-magnets (4), located on said pole-pieces (3), arranged in a face-to-face orientation, generating the static magnetic field therein said cage.

It is still in the scope of the present invention wherein the self-fastening cage's contour is defined by a polyhedron such that tetrahedron, pentahedron or hexahedron.

It is still in the scope of the present invention wherein the superimposed walls (1) and pole-pieces (3) are metal alloys, preferably a soft iron alloy.

It is still in the scope of the present invention wherein at least one of the cage walls is interconnected with adjacent wall by means of a protruding-edge connection defining a tolerance (1) enabling said cage's wall to displace, and to prevent leakage of the cage's magnetic field.

It is still in the scope of the present invention wherein at least a portion of side-magnets (2) are superconductors or ferromagnets.

It is still in the scope of the present invention wherein said pole-pieces are separated by an air gap at a predetermined distance (F).

It is still in the scope of the present invention wherein the pole-piece area, the dimensions of side-magnets (2), i.e. its thickness (C), width (D), length (E), the main magnet and the air gap (F) determine the magnetic field strength and its uniformity.

It is still in the scope of the present invention wherein the self-fastening cage further comprising at least one corner-magnet (5) adapted to adjust the magnetic field therein.

It is still in the scope of the present invention wherein said corner-magnets form a polyhedron, cylinder or any combination thereof.

It is still in the scope of the present invention wherein at least one cylinder corner-magnet comprises at least one bore exceeded along the corner magnet's longitudinal axis, adapted thus to accommodate a rotating means suitable for adjusting the magnetic field provided in said cage.

It is still in the scope of the present invention wherein at least one cylinder corner-magnet is rotated clockwise or counterclockwise.

It is still in the scope of the present invention wherein said corner-magnets are positioned at a predetermined location adjacent to the corner of the cage, so that a pre-adjustment of the magnetic field is provided. Said corner-magnets are placed outside the pole-pieces, inside the pole-pieces, between the side magnets, at any distance from the pole-pieces and from the side magnets, or any combination thereof.

It is lastly in the scope of the present invention, wherein said corner-magnet is defined by parameters; namely the angle between the flux line of the magnet and the edge of the pole-piece ($\alpha$), its length (A) and its width (B).

It is also an object of the present invention to provide a method of obtaining a self-fastening cage characterized by an outside shell, comprising superimposing at least three flexi-jointed walls (1) so that a homogeneous, stable and uniform magnetic field is provided therein.

The method additionally comprises constructing a self-fastening cage and a cavity encapsulate therein; and superposing corner-magnets enabling a homogeneous, stable and uniform magnetic field therein.

Another important object of this invention is to provide a method comprising steps of adjusting $\alpha$ to optimize the uniformity of the field.

Yet another object of the invention is to provide a method further comprising rotating one or more cylinder corner-magnets hence providing fine adjustments of the magnetic field; directing the flux line; and compensating the field created by impurities occurred during the manufacturing process of magnet materials.

While the invention is susceptible to various modifications and alternative forms, specific embodiments thereof have been shown by way of example in the drawings and will herein be described in detail. It should be understood, however, that it is not intended to limit the invention to the particular forms disclosed, but on the contrary, the intention is to cover all modifications, equivalents, and alternatives falling within the spirit and scope of the invention as defined by the appended claims.

BRIEF DESCRIPTION OF THE INVENTION

Figure 2:
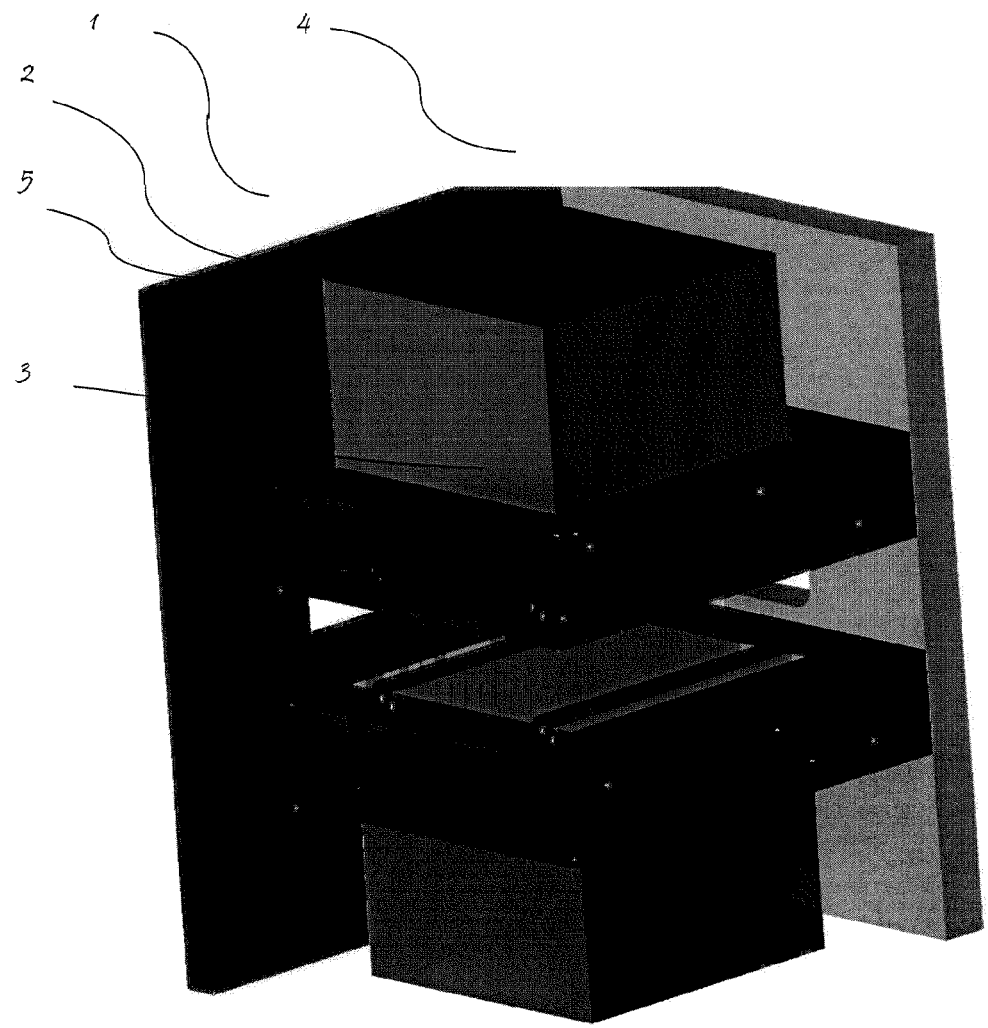
Figure 3:
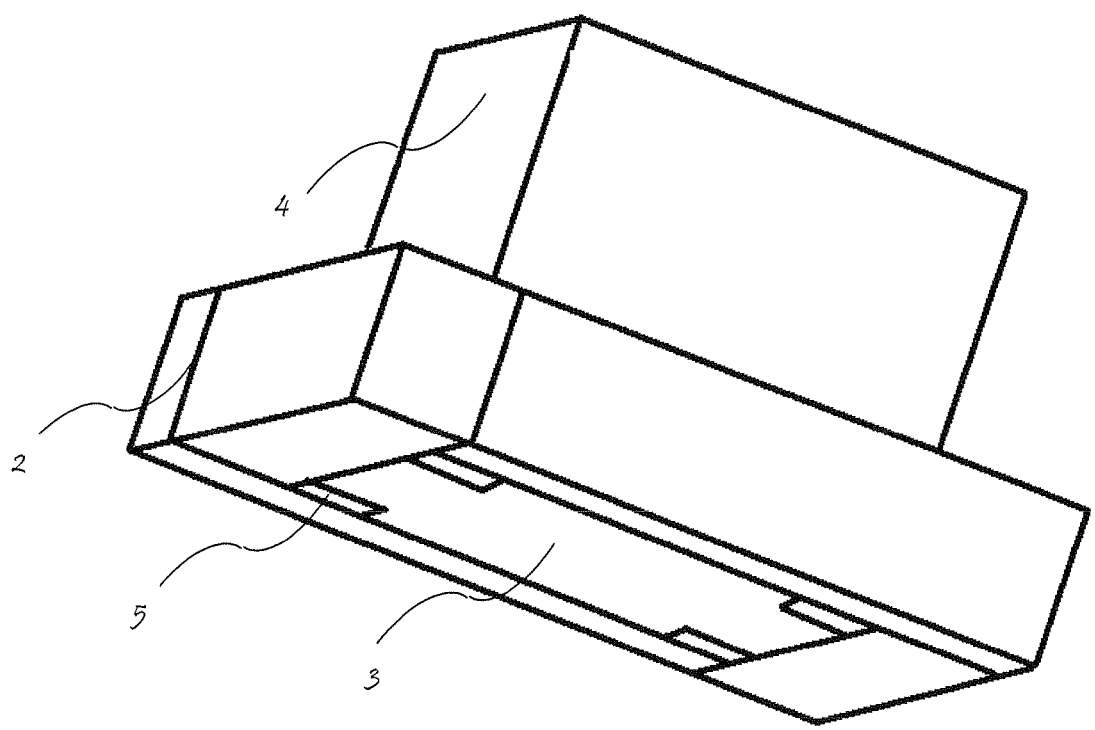
Figure 4:
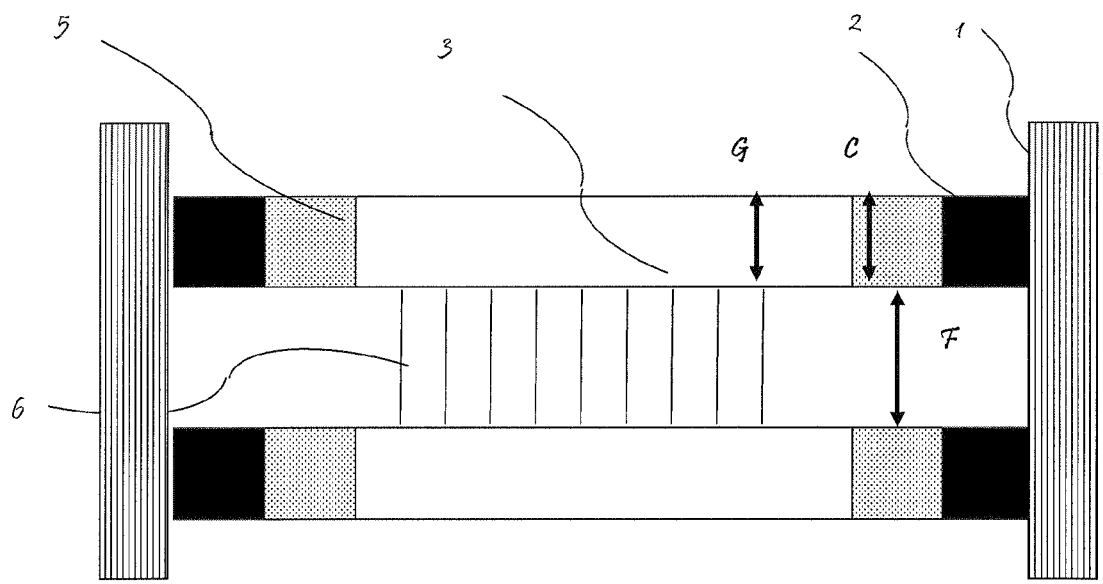
Figure 5:
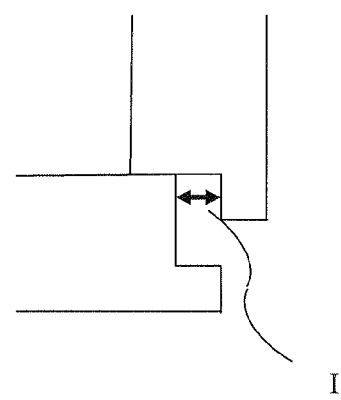
Figure 6:
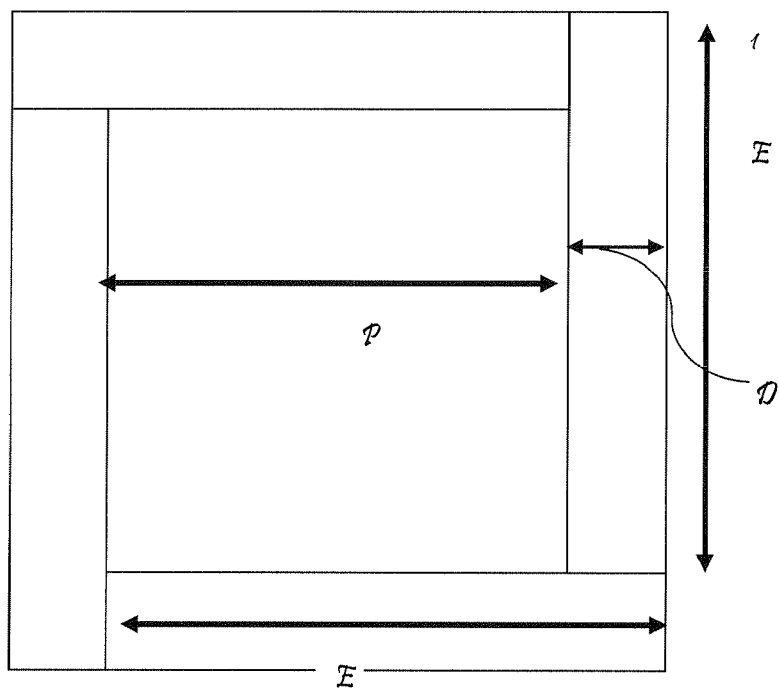
Figure 7:
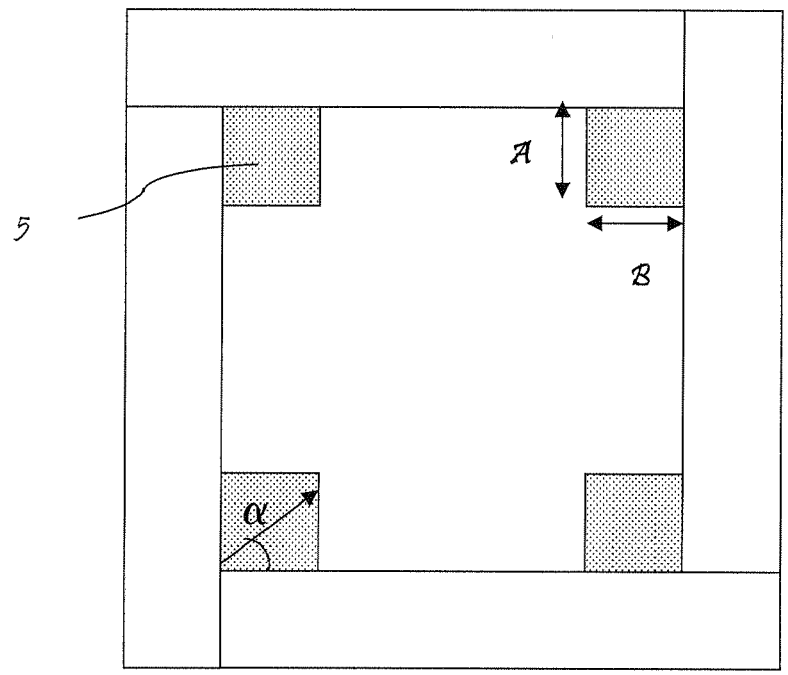
Figure 8:
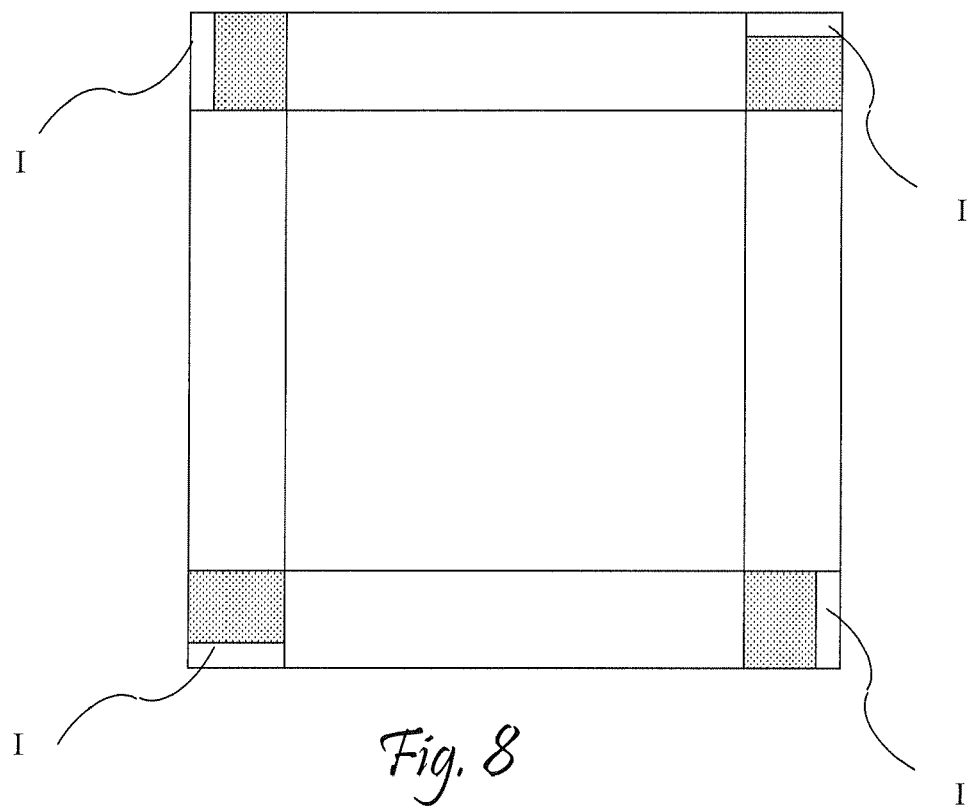
Figure 9:
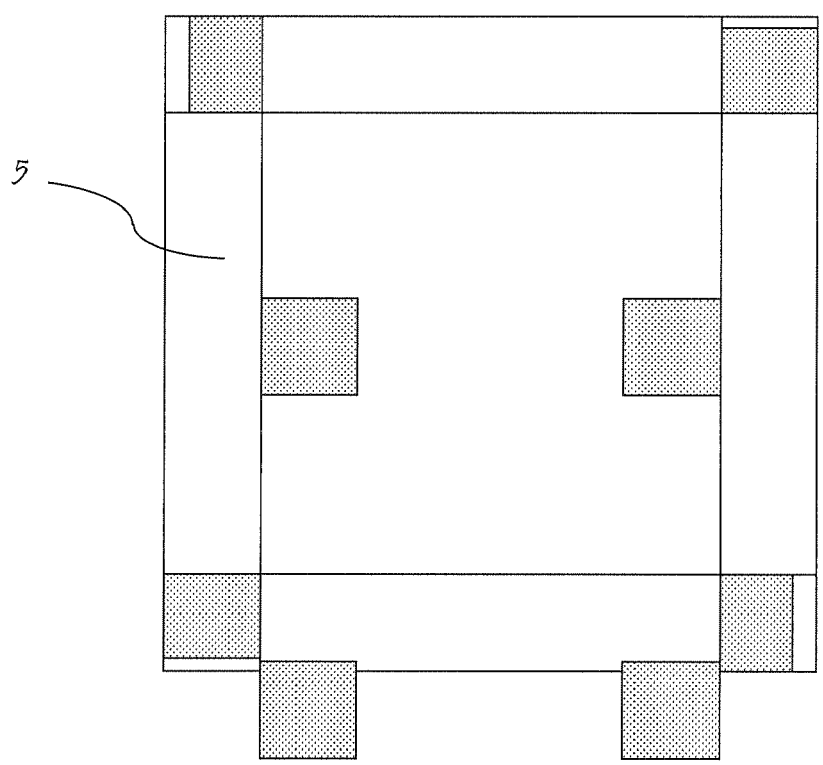
Figure 10:
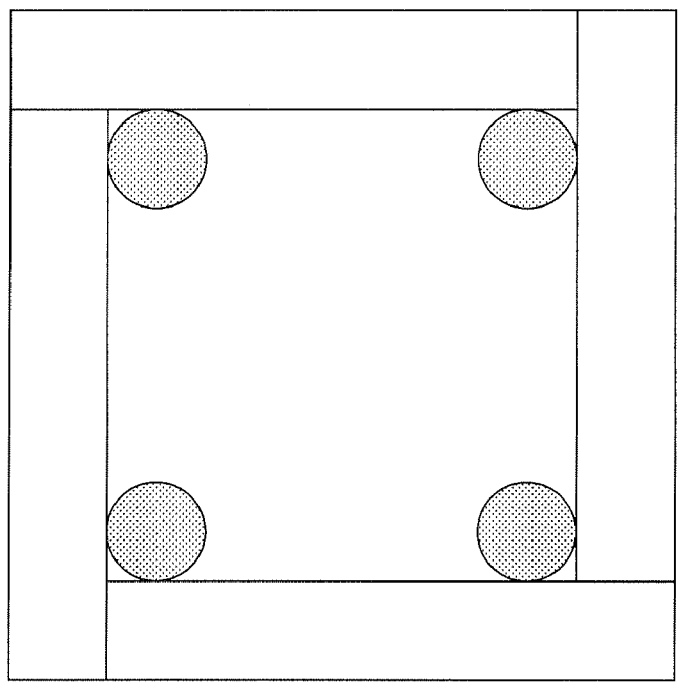
Figure 11:
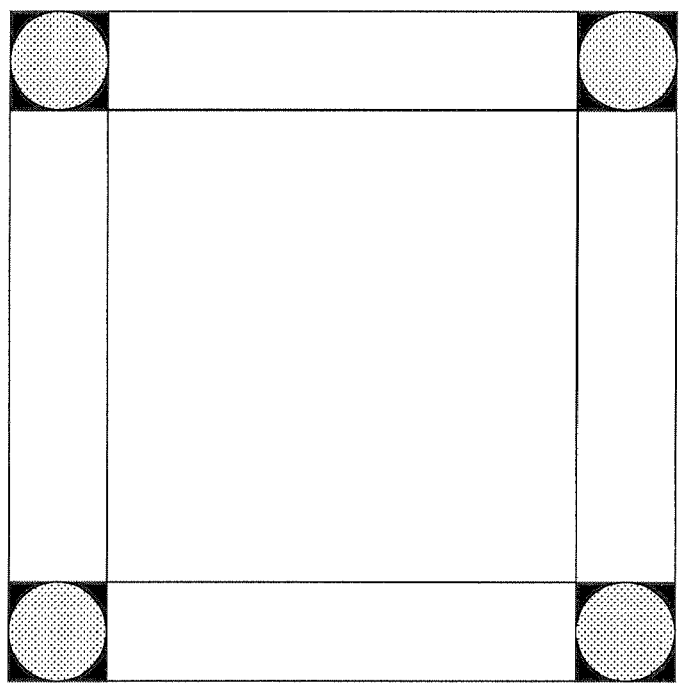
Figure 12:
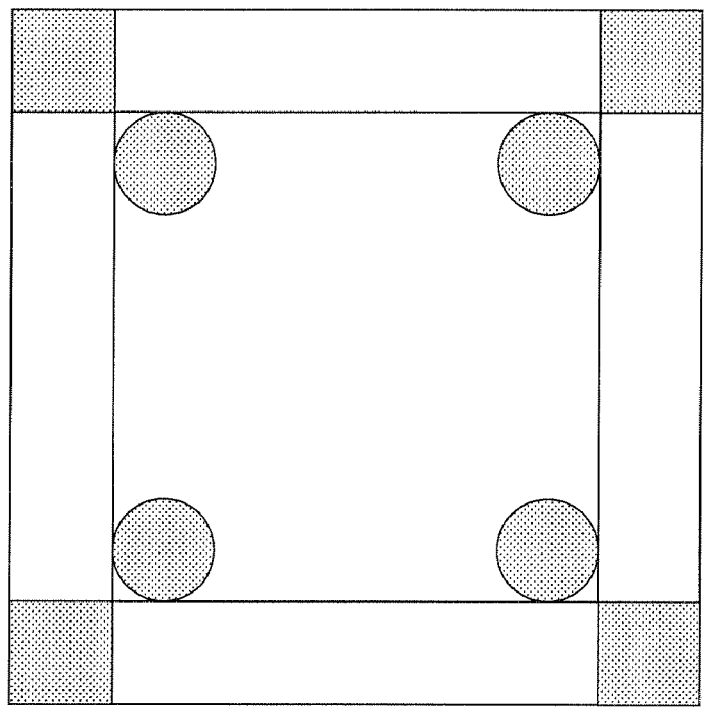
Figure 13:
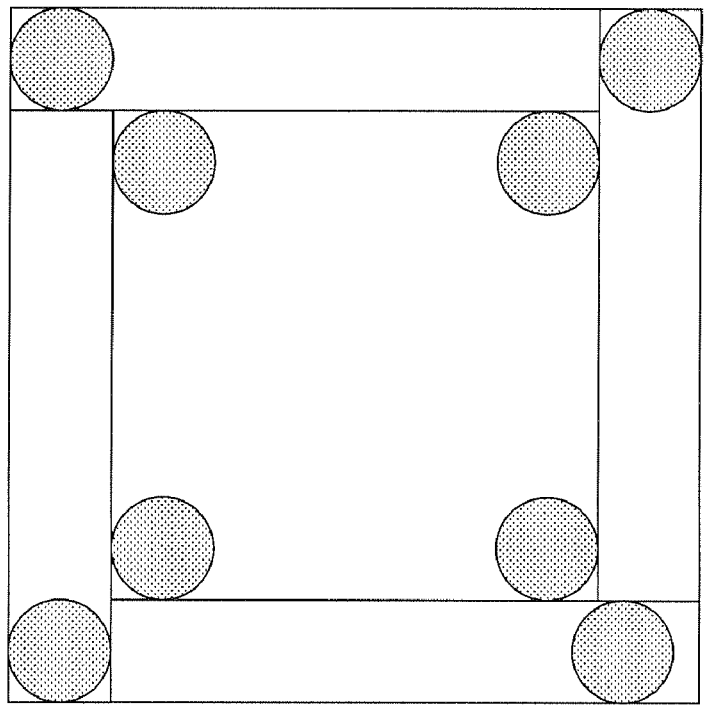
Figure 14:
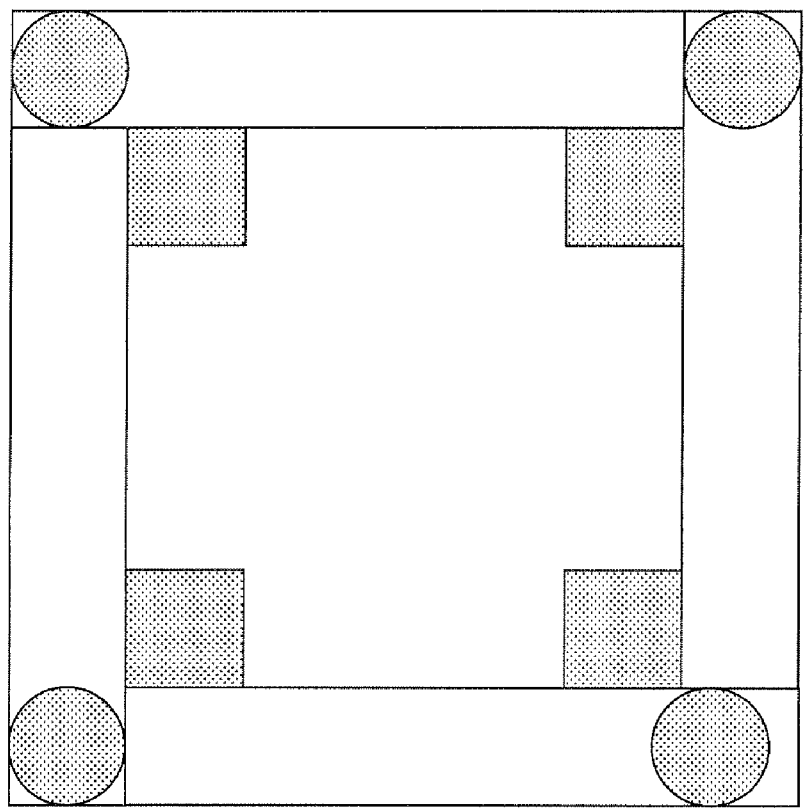
Figure 15:
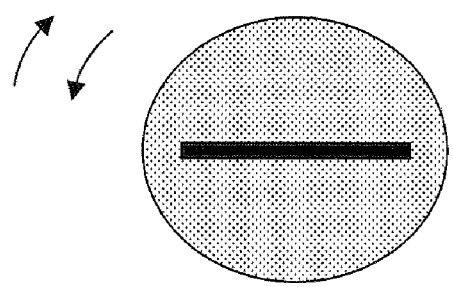
Figure 16:
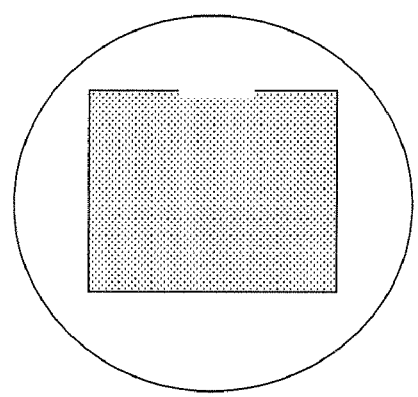
Figure 17:
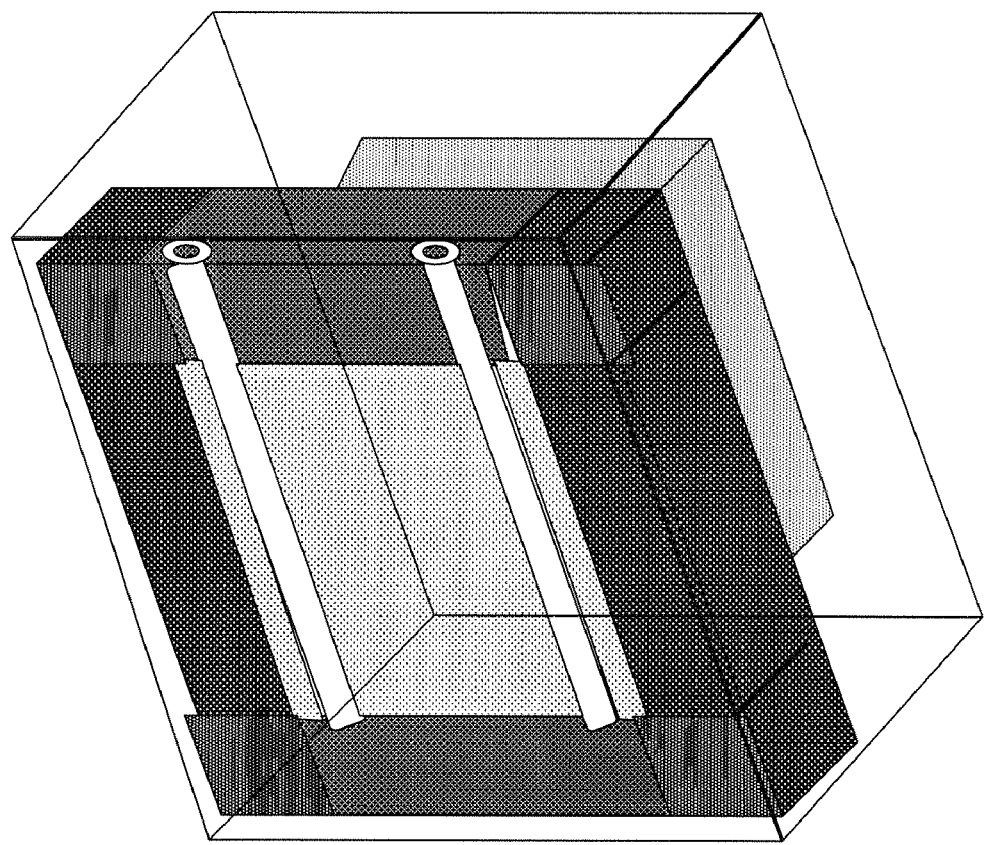
Figure 18:
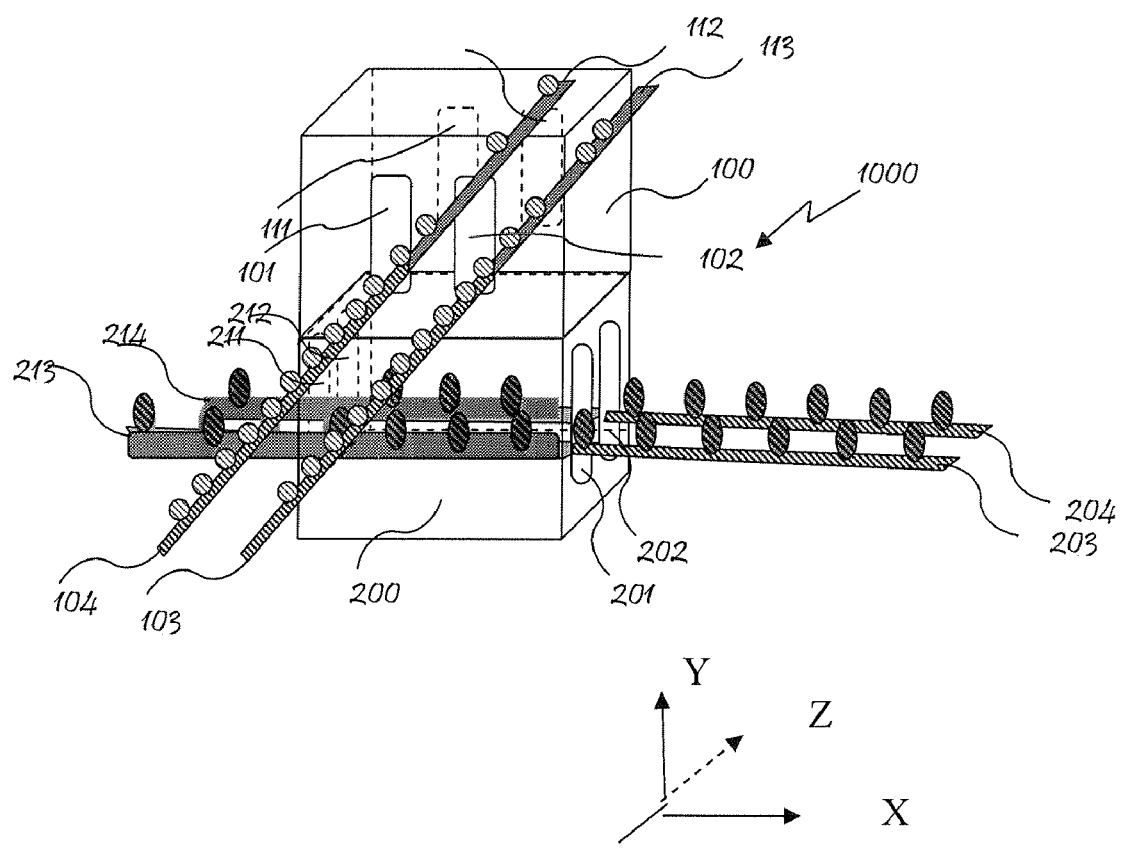

In order to understand the invention and to see how it may be implemented in practice, several embodiments will now be described, by way of non-limiting example only, with reference to the accompanying drawing, in which FIG. 1 schematically presents a partial sectional top and out of scale view, with respect to an axial plane of the 3D MRD (100) wherein the shape of a square parallelepiped is provided, having four cage walls (1), four side magnets (2); and a pole-piece (3); said cage walls and side-magnets are essentially interconnected in a superimposed manner such that a self-fastening cage is obtained;

FIG. 2 schematically presents a entire perspective view of the of the 3D MRD, having two cage walls (1), eight side magnets (2); two pole-pieces (3); two main magnet (4) and eight square corner-magnets (5) and four cylinder corner-magnets located inside the pole-pieces; all of them are arranged in two equal groups face-to-face orientation;

FIG. 3 schematically presents a perspective view of the 3D permanent magnet assembly, having four side magnets (2), one pole-piece (3), one main magnet (4) and four square corner-magnets (5);

FIG. 4 schematically presents a partial sectional side view, with a respect to an axial plane of the 3D permanent magnet assembly, having two cage walls (1), four side magnets (2), two pole-pieces in a face-to-face orientation (3), and four corner-magnets (5); the flux lines are represented (6) between the pole-pieces; the corner-magnets' thickness (C) and the pole-pieces' thickness (G) are represented;

FIG. 5 schematically presents a partial sectional side view of the protruding-edge connection defining a tolerance interval (I) between the corner-magnets and the cage walls, enabling displacement of the cage walls and preventing leakage of the cage's magnetic field;

FIG. 6 schematically presents the four side-magnets, characterized by their length (E), and their width (D), and a pole-piece defined by its length (P);

FIG. 7 schematically presents the permanent magnet assembly of FIG. 6 having four square corner-magnets (5) located inside the pole-piece; in this case, side-magnets are extended to fit a perfect 90° corner;

FIG. 8 schematically presents the permanent magnet assembly of FIG. 6 having four square corner-magnets placed outside the pole-piece between the side magnets;

FIG. 9 schematically presents the permanent magnet assembly of FIG. 6 having eight square corner-magnets; four square corner-magnets outside the pole-piece between the side magnets, and four square corner-magnets at the corners inside the pole-piece;

FIG. 10 schematically presents the permanent magnet assembly of FIG. 6 having four cylinder corner-magnets (3) inside the pole-piece;

FIG. 11 schematically presents the permanent magnet assembly of FIG. 6 having four cylinder corner-magnets placed outside the pole-piece between the side magnets;

FIG. 12 schematically presents the permanent magnet assembly of FIG. 6 having four square corner-magnets placed at the corner outside the pole-piece between the side magnets; and four cylinder magnets located at the corner inside the pole-piece;

FIG. 13 schematically presents the permanent magnet assembly of FIG. 6 having eight cylinder corner-magnets placed at the corner outside and inside the pole-piece;

FIG. 14 schematically presents the permanent magnet assembly of FIG. 6 having four cylinder corner-magnets placed at the corner outside the pole-piece between the side magnets; the four square magnets are at the corner inside the pole-piece;

FIG. 15 schematically presents a sectional side view of a cylinder corner-magnet, according to one embodiment of the present invention, having a bore exceeded along the corner magnet's longitudinal axis, adapted to accommodate a rotating means clockwise or counterclockwise, suitable for adjusting the magnetic field;

FIG. 16 schematically presents a sectional side view of a cylinder corner-magnet having a cylinder plastic envelope with a square magnet therein;

FIG. 17 schematically presents a perspective view of the 3D permanent magnet assembly with two cylinder corner-magnets located inside the pole-piece;

FIG. 18 schematically presents schematically presenting a stratificated feeding system in a MRD (1000) according to one embodiment of the present invention; and FIGS. 19A to 19E illustrate schematic out of scale top views of the cavity inside a MRD 1000.

Figure 20:
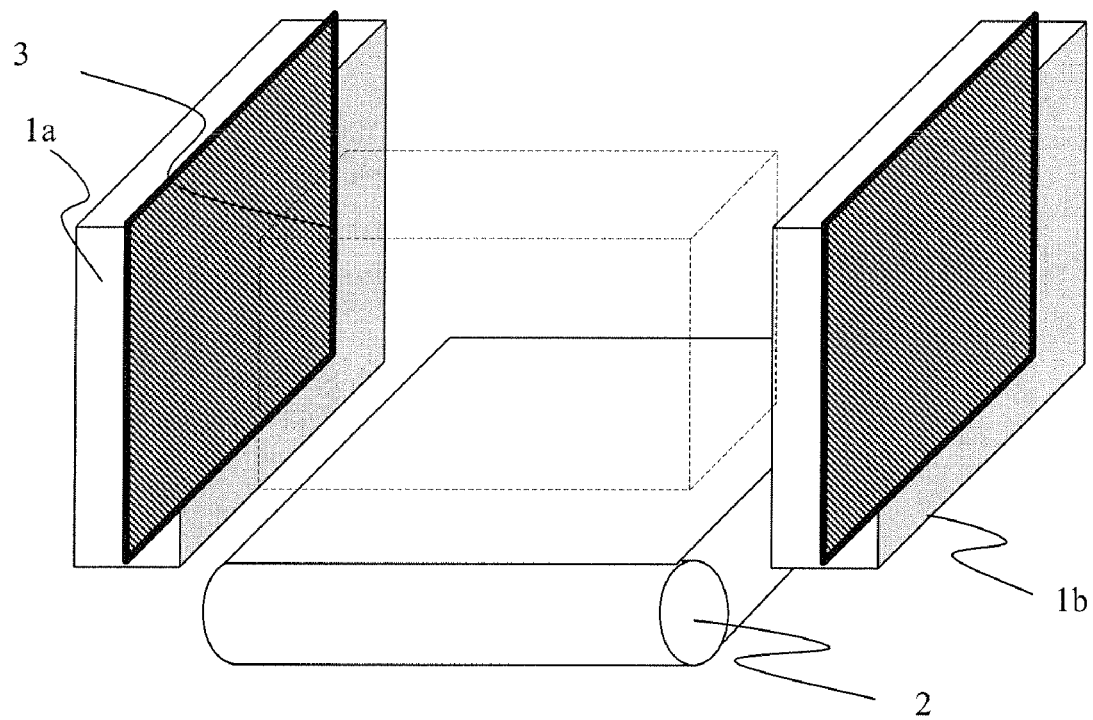
Figure 21:
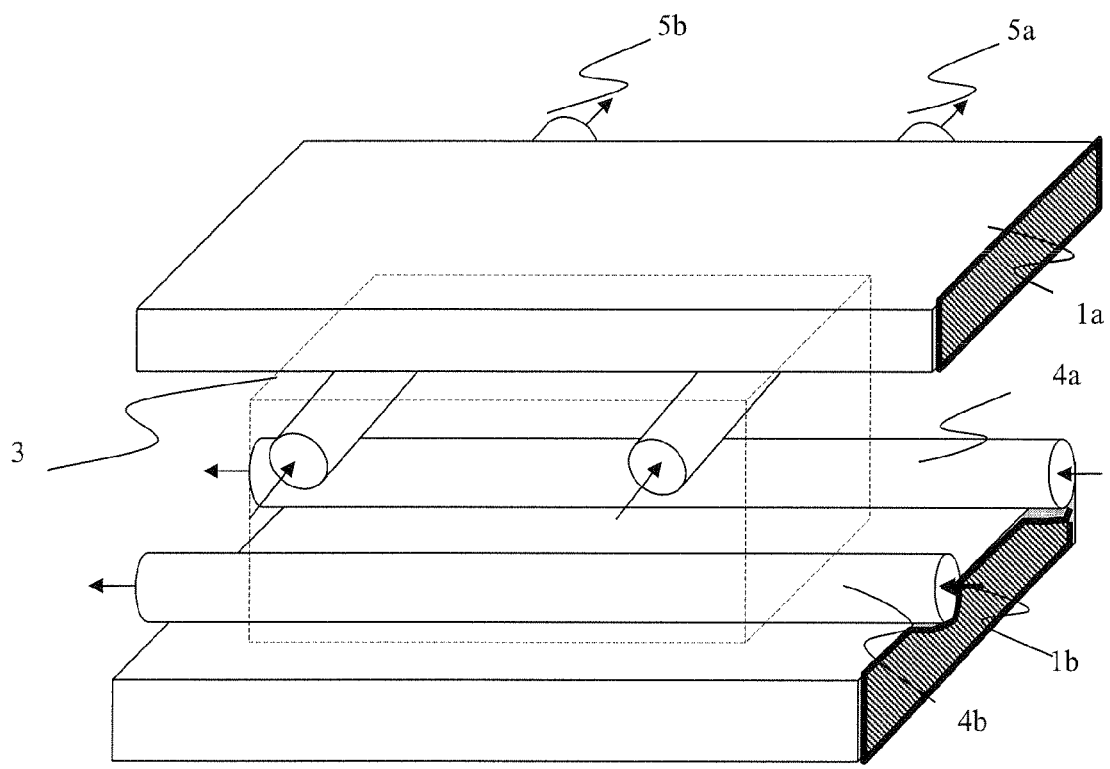
Figure 22:
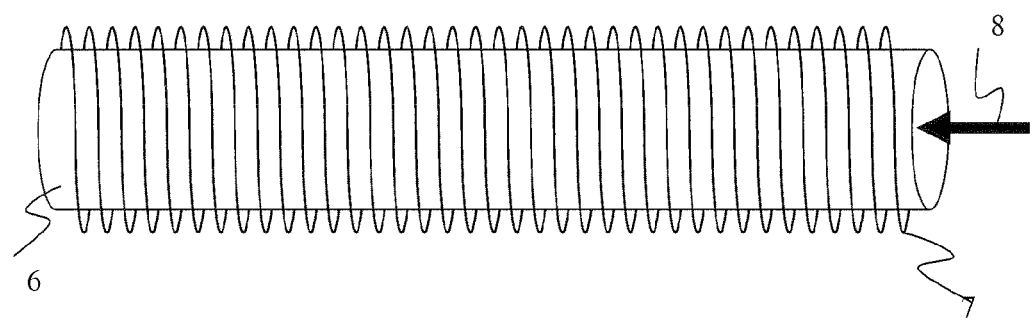

FIG. 20 schematically represents one embodiment of the current invention wherein the pole pieces are situated to the sides of the conveyor belt which lies wholly outside the region of uniform magnetic field;

FIG. 21 schematically represents another embodiment of the current invention wherein two orthogonal layers of parallel pipes pass through the region of uniform magnetic field; and FIG. 22 schematically represents a single fluid imaging unit showing the pipe, gradient coil and direction of fluid flow.

In order to simplify the drawings, only one polarity is shown in FIGS. 1, 3, 6-14 and 17. To have a complete assembly, the image has to be mirrored in such a way that a north and south pole are presented.

DETAILED DESCRIPTION OF PREFERRED EMBODIMENTS

The following description is provided, alongside all chapters of the present invention, so that to enable any person skilled in the art to make use of said invention and sets forth the best modes contemplated by the inventor of carrying out this invention. Various modifications, however, will remain apparent to those skilled in the art, since the generic principles of the present invention have been defined specifically to provide an efficient self-fastening cage of a MRD (100) for providing a homogeneous, stable and uniform magnetic field therein, characterized by an outside shell comprising at least three flexi-jointed superimposed walls (1) and methods thereof.

The term 'self-fastening' refers hereinafter to a strong magnetic connection between the side-magnets and the cage walls. The magnets' edges are attracted to each other such that a closed form is provided. The cage, magnetically attracted to the side-magnets, supports itself without need for another connection.

The term 'flexi-jointed' refers hereinafter to the geometric arrangement of the cage walls, such that at least a portion of said walls is left free to move and thus, if dislocation of one of the walls occurs, is able to re-adjust so as to fit with adjacent (sometimes perpendicular) wall in a closed form clockwise or counterclockwise. The flexi-jointed walls form the cage in such a manner that at least one of its x, y or z dimensions is adjustable; hence a variation of the cage contour, size or shape, e.g., cross section is obtained.

The term 'superimposed' refers hereinafter to the arrangement of the cage walls; each wall is placed over another one in an overlaying manner in a closed form clockwise or counterclockwise.

The term 'magnetic resonance device' (MRD) applies hereinafter to any Magnetic Resonance Imaging (MRI) device, any Nuclear Magnetic Resonance (NMR) spectroscope, any Electron Spin Resonance (ESR) spectroscope, any Nuclear Quadrupole Resonance (NQR) or any combination thereof.

The term 'tolerance' refers hereinafter to the interval between the corner-magnets and the cage walls, enabling displacement of the walls.

The term 'about' refers hereinafter to ±20% of the defined measure.

The term 'plurality' applies hereinafter to any integer greater than or equal to one.

The term 'adjust' applies hereinafter to a change of the magnet's parameters before or after assembly, to optimize the magnetic field uniformity.

The term 'pole-piece' applies hereinafter to an element of high permeability material used to shape the uniformity of the magnetic flux from a permanent magnet.

The term 'side-magnets' applies hereinafter to permanent magnets arranged around the sides of pole-pieces.

The term 'sample imaging units' applies hereinafter to a device adapted to provide a means of measuring the magnetic resonance of a sample within a uniform magnetic field.

The term 'fluid imaging units' applies hereinafter to a device adapted to provide a means of measuring the magnetic resonance of a fluid sample within a uniform magnetic field.

The term 'switching rate' applies hereinafter to the number of separated devices which are activated in a given time period.

The term 'stratificated device' refers hereinafter to any MRD 100 which is characterized by more than two layers, forming more than two detecting volumes, e.g., in a top-and-bottom configuration and/or at least two adjacent feeding streams carrying a plurality of objects in said configuration.

It is thus one embodiment of the present invention to provide an efficient self-fastening cage of a MRD (100) for providing a homogeneous, stable and uniform magnetic field therein, characterized by an outside shell comprising at least three flexi-jointed superimposed metal alloy walls (1).

It is also in the scope of the present invention wherein the MRD further comprises at least six side-magnets (2) arranged in two equal groups face-to-face orientation in a magnetic connection with the cage walls (1), increasing the overall strength of the magnetic field provided in said cage; at least two pole-pieces (3), arranged in a face-to-face orientation in between side-magnets (2); and, at least two main-magnets (4), located on said pole-pieces (3), arranged in a face-to-face orientation, generating the static magnetic field therein said cage.

Reference is made now to FIG. 1, schematically presenting a partial sectional top and out of scale view, with respect to an axial plane of the 3D MRD (100) wherein the shape of a square parallelepiped is provided, having four cage walls (1), four side magnets (2); and a pole-piece (3); said cage walls and side-magnets are essentially interconnected in a superimposed manner wherein the edges of each side-magnets wall are separated by an air gap from the edges of the adjacent side-magnets wall such that a self-fastening cage is obtained.

Reference is made now to FIG. 2, schematically presenting a entire perspective view of the of the 3D MRD, having two cage walls (1), eight side magnets (2); two pole-pieces (3); two main magnet (4) and eight square corner-magnets (5) and four cylinder corner-magnets located inside the pole-pieces; all of them are arranged in two equal groups face-to-face orientation.

Reference is made now to FIG. 3, schematically presenting a perspective view of the 3D permanent magnet assembly, having four side magnets (2), one pole-piece (3), one main magnet (4) and four square corner-magnets (5).

Reference is made now to FIG. 4 schematically presenting a partial sectional side view, with a respect to an axial plane of the 3D permanent magnet assembly, having two cage walls (1), four side magnets (2), two pole-pieces in a face-to-face orientation (3), and four corner-magnets (5); the flux lines are represented (6) between the pole-pieces; the corner-magnets' thickness (C) and the pole-pieces' thickness (G) are represented.

In one such example a pole-piece is constructed from small granules of ferromagnetic material, the diameter of each granule is of the order of one micron. Said granules are embedded within a plastic coating which serves to strengthen the granules and prevent distortion of their shapes. The material is cut into small cubes which are stuck together with non-conducting glue and with spacers between the granules. Such a construction prevents the formation of large eddy currents within the pole-piece, thereby increasing the efficiency of the magnet.

It is still in the scope of the present invention wherein a flexi-jointed self-fastening cage, is adapted to decrease at least one of its contour x, y, z contour dimensions.

It is still in the scope of the present invention wherein the self-fastening cage's contour is characterized by a polyhedron shape, such as tetrahedron, pentahedron or hexahedron.

It is still in the scope of the present invention wherein the superimposed walls (1) and pole-pieces (3) are metal alloys, preferably soft iron alloy.

Reference is made now to FIG. 5 schematically presenting a partial sectional side view of the protruding-edge connection defining a tolerance interval (I) between the corner-magnets and the cage walls, enabling displacement of the cage walls and preventing leakage of the cage's magnetic field.

It is still in the scope of the present invention wherein at least one of the cage walls is interconnected with adjacent wall by means of a protruding-edge connection defining a tolerance (1) enabling said cage's wall to displace, and to prevent leakage of the cage's magnetic field such that $E+A<P+D$.

It is still in the scope of the present invention wherein at least a portion of side-magnets (2) are superconductors or ferromagnets. The term 'superconductors' refers hereinafter also to electromagnets that are partially built from superconducting materials and therefore reach much higher magnetic field intensity. The term 'ferromagnets' refers hereinafter also to materials that can exhibit a spontaneous magnetization. It is responsible for most of the magnetic behavior encountered in everyday life and is the basis for all permanent magnets, as well as the metals that are noticeably attracted to them.

It is still in the scope of the present invention wherein said pole-pieces are separated by an air gap at a predetermined distance (F).

It is still in the scope of the present invention wherein the pole-piece area, its thickness (G), the dimensions of side-magnets (2), i.e. its thickness (C), width (D), length (E), the main magnet and the air gap (F) determine the magnetic field strength and its uniformity.

It is still in the scope of the present invention wherein said pole-pieces are selected from metal alloys, and especially from steel material.

It is still in the scope of the present invention further comprising at least one corner-magnet (5) adapted to adjust the magnetic field therein.

It is still in the scope of the present invention wherein said corner-magnets form a polyhedron, cylinder or any combination thereof, for example a cylinder plastic envelope with a square magnet therein.

It is still in the scope of the present invention wherein at least one cylinder corner-magnet comprises at least one bore exceeded along the corner magnet's longitudinal axis, adapted thus to accommodate a rotating means suitable for adjusting the magnetic field provided in said cage.

It is still in the scope of the present invention wherein at least one cylinder corner-magnet is rotated clockwise or counterclockwise.

The advantage of the cylinder magnet lies in the possibility of adjusting the direction of the flux line by rotating the rods for fine adjustments.

When a vertical rod magnet replaces the polyhedron magnet; at the corner of the pole-piece, inside or outside the pole-piece, the flux angle can be adjusted after assembly.

It is still in the scope of the present invention wherein said corner-magnets are positioned at a predetermined location adjacent to the corner of the cage so that a pre-adjustment of the magnetic field is provided. Said corner-magnets are placed outside the pole-pieces, inside the pole-pieces, between the side magnets, at any distance from the pole-pieces and from the side magnets, or any combination thereof.

Different configurations of implementing corner-magnets concept for modifying and shimming the magnetic field are possible.

For example, the following examples that are being provided in a non-limiting manner are combinations of polyhedron magnets and vertical rod magnets:

1. Solely side magnets, as presented in FIG. 6.
2. Polyhedron magnets are placed inside the pole-piece as presented in FIG. 7.
3. Polyhedron magnets are placed outside the pole-piece between the side magnets as presented in FIG. 8.
4. Polyhedron magnets are placed outside the pole-piece between the side-magnets. Polyhedron magnets are also placed at the corners inside the pole-piece as presented in FIG. 9.
5. Vertical rod magnets are placed inside the pole-piece as presented in FIGS. 10 and 17.
6. Vertical rod magnets are placed outside the pole-piece between the side magnets as presented in FIG. 11.
7. Polyhedron magnets are placed at the corner outside the pole-piece between the side magnets. Vertical rod magnets are placed inside the pole piece, as presented in FIG. 12.
8. Vertical rod magnets are placed at the corners inside and outside the pole pieces as presented in FIG. 13.
9. Polyhedron magnets are placed at the corner inside the pole-piece. Vertical rod magnets are placed at the corner outside the pole-piece between the side magnets as presented in FIG. 14.

Reference is made now to FIG. 6 schematically presenting the four side-magnets, characterized by their length (E), and their width (D), and a pole-piece defined by its length (P).

Reference is made now to FIG. 7 schematically presenting the permanent magnet assembly of FIG. 6 having four square corner-magnets (5) located inside the pole-piece; in this case, side-magnets are extended to fit a perfect 90° corner.

Reference is made now to FIG. 8 schematically presenting the permanent magnet assembly of FIG. 6 having four square corner-magnets placed outside the pole-piece between the side magnets.

Reference is made now to FIG. 9 schematically presenting the permanent magnet assembly of FIG. 6 having eight square corner-magnets; four square corner-magnets outside the pole-piece between the side magnets, and four square corner-magnets at the corners inside the pole-piece.

Reference is made now to FIG. 10 schematically presenting the permanent magnet assembly of FIG. 6 having four cylinder corner-magnets (3) inside the pole-piece.

Reference is made now to FIG. 11 schematically presenting the permanent magnet assembly of FIG. 6 having four cylinder corner-magnets placed outside the pole-piece between the side magnets.

Reference is made now to FIG. 12 schematically presenting the permanent magnet assembly of FIG. 6 having four square corner-magnets placed at the corner outside the pole-piece between the side magnets; and four cylinder magnets located at the corner inside the pole-piece.

Reference is made now to FIG. 13 schematically presenting the permanent magnet assembly of FIG. 6 having eight cylinder corner-magnets placed at the corner outside and inside the pole-piece.

Reference is made now to FIG. 14 schematically presenting the permanent magnet assembly of FIG. 6 having four cylinder corner-magnets placed at the corner outside the pole-piece between the side magnets; the four square magnets are at the corner inside the pole-piece.

It is also in the scope of the present invention, wherein a corner-magnet is defined by parameters, namely the angle between the flux line of the magnet and the edge of the pole-piece ($\alpha$), its length (A), its width (B) and its thickness (C).

Reference is made now to FIG. 15, schematically presenting a sectional side view of a cylinder corner-magnet, according to another embodiment of the present invention, having a bore exceeded along the corner magnet's longitudinal axis, adapted to accommodate a rotating means clockwise or counterclockwise, suitable for adjusting the magnetic field.

Reference is made now to FIG. 16 schematically presenting a sectional side view of a cylinder corner-magnet having a cylinder plastic envelope with a square magnet therein.

Reference is made now to FIG. 17 schematically presenting a perspective view of the 3D permanent magnet assembly with two cylinder corner-magnets located inside the pole-piece.

According to one mode of the invention, the corner-magnet is a cube if A is equal to B, or a parallelepiped, if A is unequal to B. The parameters A, B, $\alpha$ can be modified in order to optimize the uniformity and the shape of the uniform volume of the magnetic field in the air gap, without changing the total dimensions of the magnet assembly. A and B are adjusted after manufacturing but the flux angle is adjusted after assembly. The thickness of the corner-magnets (C) can be greater, lesser or equal to the thickness of the pole-pieces (G).

One mode to achieve a uniform magnetic flux density in the air gap of a permanent magnet assembly according to the present invention is to build a symmetrical configuration where the side magnets are equidistant from the center point of the pole-piece. This mode is known in the art. An asymmetrical assembly performance is equal to or better than a symmetrical magnet assembly because it can be adapted for the needs of the specific application by using the volume of the air gap and shaping the size of the uniform field region in the air gap. This mode is not known in the art. The ability to modify parameters of the inner side magnets, like A, B and α, compensates for lack of symmetry.

It is another object of the present invention to provide a method of obtaining a self-fastening cage. The method is characterized by an outside shell, comprising superimposing at least three flexi-jointed walls, so that a homogeneous, stable and uniform magnetic field is provided therein.

The aforesaid method may additionally comprises constructing a self-fastening cage and a cavity encapsulate therein; superposing corner-magnets enabling a homogeneous, stable and uniform magnetic field; and, positioning at least one object to be examined in said cavity.

The cavity dimension is preferably adapted according to the size of the objects to be analyzed.

Another important object of the present invention is to provide a method comprising steps of adjusting a to optimize the uniformity of the field.

Yet another object of the invention is to provide a method further comprising rotating one or more cylinder corner-magnets hence providing fine adjustments of the magnetic field; directing the flux line; and compensating the field created by impurities occurred during the manufacturing process of magnet materials.

In a MRD as defined in any of the above, the present invention also discloses an optional improved feeding system. This system comprises inter alia at least two adjacent feeding streams carrying a plurality of objects to be detected or analyzed simultaneously or in any predetermined sequence. More specifically, and according to another embodiment of the present invention, the stratificated MRD may comprise inter alia at least two feeding systems as defined above. Said at least two feeding systems are relatively oriented in one plane (2D). Additionally or alternatively, a stratificated MRD comprising at least two feeding systems as defined above is disclosed. The at least two feeding systems are oriented in a plurality of planes thus being in a 3D orientation. Said streams are possibly yet not exclusively in a parallel orientation, perpendicular orientation or a combination thereof.

Reference is made now to FIG. 18, schematically presenting a stratificated feeding system in an MRD (1000) according to one embodiment of the present invention. Here for example and in a non-limiting manner, MRD comprising two adjacent feeding systems 100 and 200 being in a respectively perpendicular orientation such that lines 103 and 104 are directed along the main Z axis while line 203 and 204 are simultaneously directed along the main X axis of the device. Lines 203 and 204, as lines 104 and 103 are illustrated hereby as an example for a plurality of n parallel lines, wherein n is any integer number equal or greater than 1. In this example and only for illustrating the technology in a non-limiting manner, n of both X lines and Z lines equals 2. In one embodiment n is between 2 and 6. In another embodiment n is between 4 and 10. In another embodiment n is significantly grater than 8.

Lower layer 200 comprising thus two feeding lines 203 and 204, being adapted to carry objects, here for example eggs, by a means of two rotating conveyor belts. Said conveyor belts are parallel, such as objects of belt 203 enter portion 200 in MRD 1000 via aperture 201 or 211, while objects of belt 204 enter portion 200 in MRD 1000 via aperture 202 or 212. Hence, the feeding directions of belts 203 and 204 may be parallel, opposite, and in a case that n is grater than 2, any combination thereof. It is acknowledged in this respect that conveyor belts or their like are selected in a non exclusive manner from a linear shape, curved shaped, zigzag, U shape or a combination thereof. Even though a 2D root is hereby illustrated, a 3D advancing root of the belt is also in the scope of the present invention. Hence for example, a possible U-belt 203 may enter cavity 200 via aperture 201 and exit the same via cavity 202 and vice versa.

In a very similar manner, conveyor belts 103 and 104 are linear and parallel belts carrying objects, e.g., oranges, via apertures 101 and 102, throughout cavity portion 100 of device 1000 to leave via apertures 112 and 113, respectively.

It is further in the scope of the present invention wherein the stratification of MRD 1000 is characterized by more than two layers, forming more than two detecting volumes 100 and 200. It is hence another embodiment of the present invention wherein said MRD comprises a plurality of m detecting volumes, wherein m is any integer number greater or equal 2. In one embodiment m is between 2 and 6. In another embodiment m is between 4 and 10. In another embodiment m is significantly grater than 8.

It is further in the scope of the present invention wherein the objects detected in each conveyor belts or their like is similar to objects detected in adjacent belt. Nevertheless, it is well in the scope of the present invention wherein various objects either in solid, liquid and/or gas phases are simultaneously detected by means of MRD 1000. The term simultaneously refers in this respect to an identical detecting effort or time, or a sequence of detection provided in a rapid course of detecting events. Said detections as well as feeding parameters are hence may be subject of processing means adapted to control and coordinate the same.

Reference is made now to FIGS. 19A to 19E illustrating a schematic out of scale top views of the cavity inside a MRD 1000. Said device comprises inter alia one feeding system, two or more adjacent feeding systems or a stratification of the same, e.g., both systems 100 and 200. For the sake of simplicity, a system comprising three parallel feeding lines is always drowned. FIG. 19A, and shows a rectangled device, comprising nine objects to be detected simultaneously or in a predetermined sequence. The feeding lines are parallel to the main longitudinal axis of the rectangle. FIG. 19B shows the same rectangle system wherein the streams are parallel to the width, comprising six objects to be detected simultaneously or in a predetermined sequence. FIG. 19C shows the same rectangle system wherein the streams are parallel to one main diagonal, comprising eight objects to be detected simultaneously or in a predetermined sequence. In this case most objects are detected in the main longitudinal system (FIG. 19A), yet the introduction of samples into the non uniform region of the magnetic field for an extended time provides for the nuclei of the sample to reach a stable orientation before being introduced into the region of uniform magnetic field. FIG. 19D shows a symmetrical cubic device, wherein the three streams are parallel to the main axis X or Y, comprising six objects to be detected simultaneously or in a predetermined sequence. FIG. 19E shows the same symmetrical cubic device, wherein the three streams are parallel to diagonal of the device, comprising seven objects to be detected simultaneously or in a predetermined sequence, i.e., about 15% more objects.

It is according to another embodiment of the current invention to present in a self-fastening cage a multi-streamed MRD comprising the following elements. A cage comprising a closed magnetic circuit constructed from strong permanent magnets and an optional shimming mechanism selected from an array of active shim coils, passive shimming elements or any combination thereof, a contained cavity within which the magnetic field strength is approximately uniform and a means, such as a plurality of conveyor belts, pipes or any other transportation means by which a plurality of samples are introduced into the region of uniform magnetic field. This device is allows for magnetic resonance measurements to be made on a plurality of samples within the region of the said uniform magnetic field.

It is according to another embodiment of the current invention to present in a self-fastening cage a multi-streamed MRD wherein the closed magnetic circuit is characterized by two pole pieces and an array of side wall magnets, which lock the magnetic flux within the magnet structure and sample cavity.

It is according to a further embodiment of the current invention to present in a self-fastening cage a multi-streamed MRD additionally comprising a plurality of sample imaging units. Each sample imaging unit comprises a conveyor belt which transports a sample into the region of uniform magnetic field, a gradient coil around said conveyor belt and a magnetic resonance measurement probe. In addition a means, such as a CPU, allows the gradient coils of each sample imaging unit to be activated in rapid succession such that magnetic resonance measurements are made on a plurality of discrete samples within the region of uniform magnetic field.

It is according to a further embodiment of the current invention to present in a self-fastening cage a multi-streamed MRD wherein a plurality of sample imaging units are situated parallel to each other such that a plurality of samples are conveyed into the region of uniform magnetic field simultaneously along a plurality of streams.

It is according to another embodiment of the current invention to present in a self-fastening cage a multi-streamed MRD wherein the pole-pieces of the magnetic circuit are orientated horizontally to the sides of the contained cavity such that at least one conveyor belt is situated outside the region of uniform magnetic field whilst conveying the sample into the region of uniform magnetic field.

It is according to a further embodiment of the current invention to present in a self-fastening cage a multi-streamed MRD wherein the pole-pieces of the magnetic circuit are orientated horizontally to the sides of the contained cavity such that at least one conveyor belt is situated beneath the region of uniform magnetic field whilst conveying the sample into the region of uniform magnetic field.

It is according to another embodiment of the current invention to present in a self-fastening cage a multi-streamed MRD wherein the pole-pieces of the magnetic circuit are orientated horizontally to the sides of the contained cavity such that at least one conveyor belt is situated above the region of uniform magnetic field whilst conveying the sample into the region of uniform magnetic field.

It is according to a further embodiment of the current invention to present in a self-fastening cage a multi-streamed MRD adapted for the measurement of fluid samples comprising a plurality of fluid imaging units. Each fluid imaging unit comprises a pipe within which a fluid sample flows through the region of uniform magnetic field, a gradient coil around said pipe and a magnetic resonance measurement probe. In addition a means, such as a CPU, allows the gradient coils of each sample imaging unit to be activated in rapid succession such that magnetic resonance measurements are made on a plurality of discrete fluid samples within the region of uniform magnetic field.

It is according to another embodiment of the current invention to present in a self-fastening cage a multi-streamed MRD wherein at least two fluid imaging units are orientated orthogonally such that the gradient coils of both units can be activated simultaneously with no interference.

It is according to a further embodiment of the current invention to present in a self-fastening cage a multi-streamed MRD wherein at least two fluid imaging units are orientated near orthogonally such that the switching time between activation of the gradient coils of each of the units can be activated almost simultaneously with a small switching time between them.

Reference is made now to FIG. 20, schematically presenting one embodiment of the current invention wherein the pole pieces, 1a and 1b, are situated to the sides of the conveyor belt, 2, which lies wholly outside the region of uniform magnetic field, 3.

Reference is made now to FIG. 21, schematically presenting another embodiment of the current invention wherein two orthogonal layers, 4 and 5, of parallel pipes pass through the region of uniform magnetic field, 3. This orientation enables the gradient coil of any pair of orthogonal pipe for example the pair 4a and 5a, to be activated simultaneously.

Reference is lastly made to FIG. 22, schematically presenting a single fluid imaging unit showing the pipe, 6, gradient coil, 7 and direction of fluid flow, 8.

The invention claimed is:

1. A stratificated MRD system, useful for analyzing a plurality of objects of adjacent feeding streams simultaneously or in any predetermined sequence, said system comprising:
   a. at least two self-fastening cage of a magnetic resonance devices (MRDs) (100) positioned adjacently, each of which is useful for providing a homogeneous, stable and uniform magnetic field therein, characterized by an outside shell; said outside shell comprising at least three flexi-jointed superimposed walls (1) disposed in a predetermined clockwise or counterclockwise arrangement; said MRD comprising: a. at least six side-magnets (2) arranged in two equal groups being in a face-to-face orientation in a magnetic connection with said outside shell, increasing the overall strength of the magnetic field provided in said cage; b. at least two pole-magnet pieces (3), arranged in a face-to-face orientation in between said side-magnets (2); and, c. at least two main-magnets (4), located on said pole-pieces (3), arranged in a face-to-face orientation, generating the static magnetic field therein said cage; wherein at least a portion of said side-magnets (2) are superconductors or ferromagnets; and,
   b. at least two adjacent feeding streams carrying a plurality of objects to be detected or analyzed into said at least two MRDs;
   further wherein at least one of said walls is interconnected with adjacent wall by means of a protruding-edge connection defining a tolerance (I) enabling said wall to displace, and to prevent leakage of the cage's magnetic field; such that said multiple feeding system provides said plurality of objects to be analyzed in either a simultaneous manner or a predetermined sequence.

2. The stratificated MRD system of claim 1, wherein said at least two feeding systems are relatively oriented in one plane (a 2D orientation).

3. The stratificated MRD system of claim 2, wherein said at least two MRDs are relatively oriented in an XnYn bi-planar orientation, n is any integer number equal or greater than 1.

4. The stratificated MRD system of claim 1, wherein at least three feeding systems are relatively oriented in a plurality of planes thus being in a 3D orientation.

5. The stratificated MRD system of claim 3, wherein said at least two MRDs are relatively oriented in an XnYnZn multi-planar orientation, n is any integer number equal or greater than 1.

6. The stratificated MRD system of claim 1, wherein said at least two feeding systems are positioned in a respectively perpendicular orientation.

7. The stratificated MRD system of claim 1, wherein said at least two feeding systems are positioned in a respectively parallel orientation.

8. The stratificated MRD system of claim 1, wherein said at least two feeding systems are positioned in a respectively parallel yet opposite orientation.

9. The stratificated MRD system of claim 1, wherein said at least a portion of said feeding systems is a conveyor belt.

10. The stratificated MRD system of claim 9, wherein said conveyor belt shaped in a manner selected from a group consisting of a linear shape, curved shaped, zigzag, U shape and a combination thereof.

11. A method for analyzing a plurality of objects by means of at least two adjacent MRDs in either simultaneous manner or a predetermined sequence, said method comprising:
 a. providing at least two self-fastening cage of a magnetic resonance devices (MRDs) (100) positioned adjacently, each of which is useful for providing a homogeneous, stable and uniform magnetic field therein, characterized by an outside shell; said outside shell comprising at least three flexi-jointed superimposed walls (1) disposed in a predetermined clockwise or counterclockwise arrangement; said MRD comprising: a. at least six side-magnets (2) arranged in two equal groups being in a face-to-face orientation in a magnetic connection with said outside shell, increasing the overall strength of the magnetic field provided in said cage; b. at least two pole-magnet pieces (3), arranged in a face-to-face orientation in between said side-magnets (2); and, c. at least two main-magnets (4), located on said pole-pieces (3), arranged in a face-to-face orientation, generating the static magnetic field therein said cage;
 b. feeding said MRDs with a plurality of objects to into said MRDs by means of one of at least two adjacent feeding streams; and,
 c. analyzing each of said fed objects by means of one of at least two MRDs;
 wherein said step (a) further comprising (i) providing at least a portion of said side-magnets (2) are superconductors or ferromagnets; and, (ii) interconnecting at least one of said walls with adjacent wall by means of a protruding-edge connection defining a tolerance (I) enabling said wall to displace, and preventing leakage of the cage's magnetic field; such that said steps of feeding and analyzing are provided simultaneously or in either a predetermined sequence.

12. The method of claim 11, further comprising a step of orienting said feeding systems in one plane (a 2D orientation).

13. The method of claim 11, further comprising a step of orienting said MRDs in an XnYn bi-planar orientation, n is any integer number equal or greater than 1.

14. The method of claim 11, further comprising a step of orienting said feeding systems in a plurality of planes (a 3D orientation).

15. The method of claim 11, further comprising a step of orienting said MRDs in an XnYnZn multi-planar orientation, n is any integer number equal or greater than 1.

16. The method of claim 11, further comprising a step of orienting said at least two feeding systems in a respectively perpendicular manner.

17. The method of claim 11, further comprising a step of orienting said at least two feeding systems in a respectively parallel manner.

18. The method of claim 11, further comprising a step of orienting said at least two feeding systems in a respectively parallel yet opposite manner.

19. The method of claim 11, further comprising a step of providing said at least a portion of said feeding systems as a conveyor belt.

20. The method of claim 19, further comprising a step of selecting said conveyor belt from a group consisting of a linear shaped belt, curved shaped belt, zigzag shaped belt, U shaped belt and a combination thereof.

* * * * *